US011211000B2

(12) United States Patent
Miura et al.

(10) Patent No.: US 11,211,000 B2
(45) Date of Patent: Dec. 28, 2021

(54) DISPLAY DEVICE AND ELECTRONIC DEVICE WITH DIFFERENTLY LAYERED WIRINGS FOR PIXEL TRANSISTORS

(71) Applicant: Sony Semiconductor Solutions Corporation, Kanagawa (JP)

(72) Inventors: Kiwamu Miura, Kanagawa (JP); Naobumi Toyomura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/321,995

(22) PCT Filed: Jul. 14, 2017

(86) PCT No.: PCT/JP2017/025733
§ 371 (c)(1),
(2) Date: Jan. 30, 2019

(87) PCT Pub. No.: WO2018/042907
PCT Pub. Date: Mar. 8, 2018

(65) Prior Publication Data
US 2019/0197957 A1   Jun. 27, 2019

(30) Foreign Application Priority Data

Aug. 30, 2016   (JP) .............................. JP2016-167659

(51) Int. Cl.
*G09G 3/3233*   (2016.01)
*G09F 9/30*   (2006.01)
(Continued)

(52) U.S. Cl.
CPC ............. *G09G 3/3233* (2013.01); *G09F 9/30* (2013.01); *G09G 3/3266* (2013.01);
(Continued)

(58) Field of Classification Search
CPC .......... G09G 3/30; G09G 3/32; G09G 3/3208; G09G 3/3216; G09G 3/3225;
(Continued)

(56) References Cited

U.S. PATENT DOCUMENTS

2005/0088381 A1* 4/2005 Park ................... H01L 27/3244
345/77
2005/0176194 A1* 8/2005 Sasaki ................. H01L 21/8221
438/197
(Continued)

FOREIGN PATENT DOCUMENTS

JP   06-011684 A   1/1994
JP   2008-033193 A   2/2008
(Continued)

*Primary Examiner* — Alexander Eisen
*Assistant Examiner* — Nelson Lam
(74) *Attorney, Agent, or Firm* — Michael Best & Friedrich LLP

(57) ABSTRACT

In a display device including: pixels including a light emitting unit and a plurality of transistors and two-dimensionally arranged in a matrix; and gate wirings of the plurality of transistors formed along a row direction of a pixel array, or an electronic device including the display device, among the plurality of transistors, a gate wiring of a switching transistor connected to an anode electrode of the light emitting unit is formed in a wiring layer different from a gate wiring of another transistor.

14 Claims, 9 Drawing Sheets

(51) Int. Cl.
*G09G 3/3266* (2016.01)
*H01L 27/32* (2006.01)

(52) U.S. Cl.
CPC ........ *H01L 27/326* (2013.01); *H01L 27/3276* (2013.01); *G09G 2300/0426* (2013.01); *G09G 2300/0866* (2013.01); *G09G 2320/0219* (2013.01)

(58) Field of Classification Search
CPC .... G09G 3/3233; G09G 3/3241; G09G 3/325; G09G 3/3258; G09G 3/3266; G09G 3/3283; G09G 2300/0417; G09G 2300/0421; G09G 2300/0426; G09G 2320/02; G09G 2320/0209; G09G 2320/0219
USPC ...................................... 345/76–83
See application file for complete search history.

(56) References Cited

U.S. PATENT DOCUMENTS

| | | | | |
|---|---|---|---|---|
| 2008/0246700 | A1* | 10/2008 | Ozawa | G09G 3/3266 345/76 |
| 2011/0049507 | A1* | 3/2011 | Choi | H01L 27/1225 257/43 |
| 2011/0273432 | A1* | 11/2011 | Koyama | G09G 3/3225 345/212 |
| 2013/0082271 | A1* | 4/2013 | Kanegae | H01L 33/387 257/72 |
| 2014/0117320 | A1* | 5/2014 | Jung | H01L 27/3276 257/40 |
| 2015/0053935 | A1* | 2/2015 | Gupta | H01L 27/1251 257/40 |
| 2015/0109280 | A1* | 4/2015 | Toyomura | G09G 3/3233 345/211 |
| 2015/0130691 | A1* | 5/2015 | Jeon | G09G 3/3225 345/82 |
| 2015/0371589 | A1* | 12/2015 | Kim | H01L 27/1229 345/208 |
| 2020/0302873 | A1* | 9/2020 | Yamazaki | G09G 3/3266 |

FOREIGN PATENT DOCUMENTS

| | | |
|---|---|---|
| JP | 2013-097050 A | 5/2013 |
| JP | 2015-034861 A | 2/2015 |

* cited by examiner

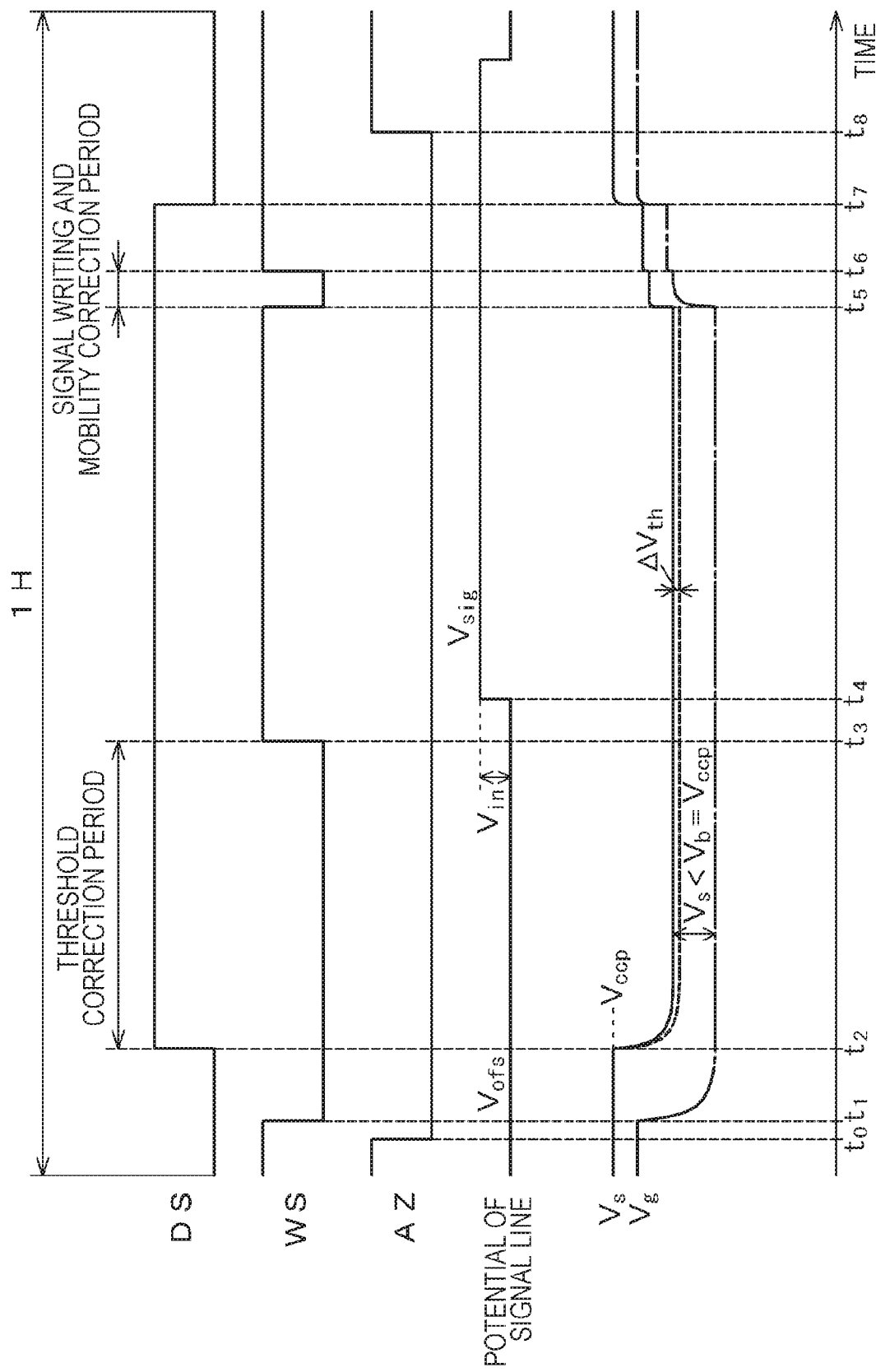

DISPLAY DEVICE AND ELECTRONIC DEVICE WITH DIFFERENTLY LAYERED WIRINGS FOR PIXEL TRANSISTORS

TECHNICAL FIELD

The present disclosure relates to a display device and an electronic device including the display device.

BACKGROUND ART

As one of display devices, there is an organic electroluminescence (hereinafter, referred to as "EL") display device using an organic EL element using an EL that is an organic material as a light emitting unit. The organic EL display device has a lower power consumption characteristic, since the organic EL element forming the light emitting unit is a self-light emitting element. The organic EL element has a structure in which an organic layer formed by stacking an organic hole transporting layer and an organic light emitting layer is provided between a first electrode and a second electrode. Then, in the organic EL display device, gradation of coloring is obtained by controlling the current value flowing through the organic EL element.

Among organic EL display devices using an organic EL element as a light emitting unit, in an active matrix type organic EL display device, a drive circuit (pixel circuit) including a plurality of transistors and a capacitor element is provided for each pixel, and driving of the organic EL element is performed by this drive circuit.

In an organic EL display device, due to process fluctuations or the like, characteristics such as a threshold voltage and mobility of a driving transistor that drives an organic EL element vary for each pixel. Then, if the transistor characteristics of the driving transistor are different for each pixel, the current value flowing in the driving transistor varies for each pixel, so that, even if the same voltage is applied to the pixels of the gate electrode of the driving transistor, the light emission luminance of the organic EL element varies for each pixel. As a result, the uniformity of a display screen is impaired. Therefore, in the organic EL display device, processing (operation) for correcting variations in the characteristics of the driving transistor is performed (see, for example, Patent Document 1).

CITATION LIST

Patent Document

Patent Document 1: Japanese Patent Application Laid-Open No. 2008-33193

SUMMARY OF THE INVENTION

Problems to be Solved by the Invention

Meanwhile, in ultra-compact display devices in which an interval between pixels decreases due to higher definition, or ultra-compact display devices called micro display, parasitic capacitance generated between adjacent wirings cannot be disregarded. In other words, there is a problem that, parasitic capacitance generated between adjacent wirings causes deterioration in display quality, more specifically, display unevenness occurs by coupling noise or the like due to parasitic capacitance.

Accordingly, an object of the present disclosure is to provide a display device capable of suppressing display unevenness caused by coupling due to parasitic capacitance caused by reducing parasitic capacitance between adjacent wirings, and an electronic device including the display device.

Solutions to Problems

A display device of the present disclosure for achieving the object described above includes:

pixels including a light emitting unit and a plurality of transistors, the pixels being two-dimensionally arranged in a matrix; and gate wirings of the plurality of transistors formed along a row direction of a pixel array, in which, among the plurality of transistors, a gate wiring of a switching transistor connected to an anode electrode of the light emitting unit is formed in a wiring layer different from a gate wiring of another transistor. Furthermore, an electronic device of the present disclosure for achieving the object described above is characterized by including the display device having the above-described configuration.

In the display device having the above-described configuration or the electronic device including the display device, the switching transistor is connected to the anode electrode of the light emitting unit, so that fluctuation in the potential of the gate wiring adversely affects the light emitting operation of the light emitting unit. Here, the gate wiring of the switching transistor is formed in a wiring layer different from the gate wiring of the another transistor, so that the wiring interval between the gate wirings of both transistors is larger than that in a case where both wirings are formed in the same wiring layer. As a result, the parasitic capacitance generated between the adjacent wirings can be reduced as compared with the case where both wirings are formed in the same wiring layer, so that it is possible to suppress the influence of coupling due to the parasitic capacitance with respect to the gate wiring of the switching transistor from the gate wiring of the another transistor.

Effects of the Invention

According to the present disclosure, parasitic capacitance between adjacent wirings can be reduced, so that it is possible to suppress display unevenness caused by coupling due to parasitic capacitance from another gate wiring with respect to the gate wiring of the switching transistor.

Note that, the effect is not necessarily limited to the effect described herein, and any of the effects described in this specification may be used. Furthermore, the effects described in this specification are merely examples, and the present invention is not limited thereto, and may have additional effects.

BRIEF DESCRIPTION OF DRAWINGS

FIG. 3 is a timing waveform diagram for explaining basic operation of the active matrix type organic EL display device.

MODE FOR CARRYING OUT THE INVENTION

Figure 1:
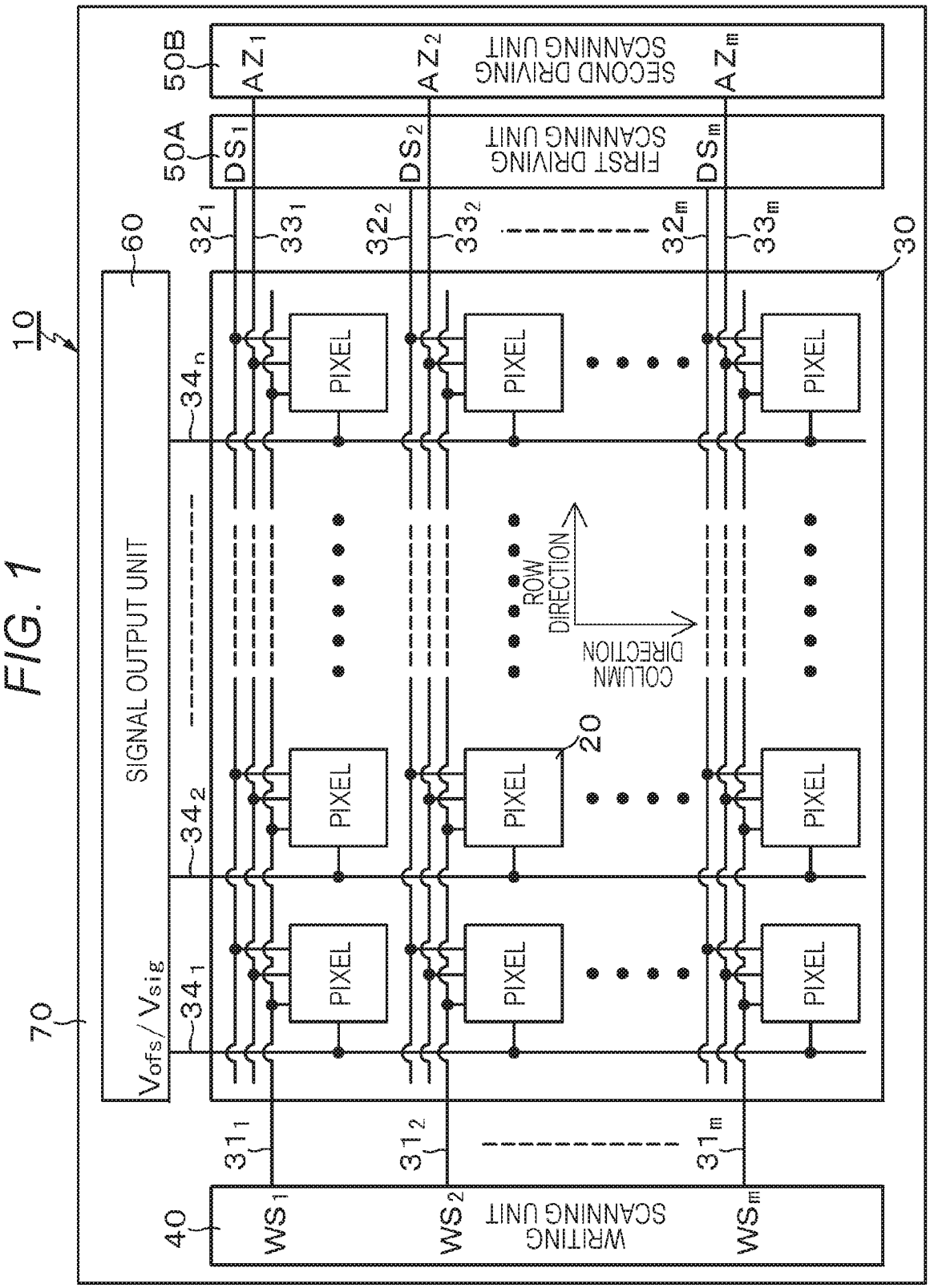
FIG. 1 is a system configuration diagram schematically showing a configuration of an active matrix type organic EL display device of the present disclosure.

Hereinafter, modes (hereinafter, referred to as "embodiments") for implementing the technology of the present disclosure will be described in detail with reference to the drawings. The technology of the present disclosure is not limited to the embodiments. In the following description, the same reference numerals will be used for the same elements or elements having the same function, and redundant description will be omitted. Note that the description will be given in the following order.

1. General explanation of display device and electronic device of the present disclosure
2. Active matrix type organic EL display device
2-1. System configuration
2-2. Pixel circuit
2-3. Basic circuit behavior
2-4. Parasitic capacitance between wirings
2-4-1. Example in which adjacent gate wirings are formed in the same wiring layer
2-4-2. First embodiment (example in which gate wiring of switching transistor is formed in wiring layer different from gate wiring of another transistor)
2-4-3. Second embodiment (modification of first embodiment: example in which power supply wiring is formed over gate wiring of switching transistor)
2-4-4. Third embodiment (modification of second embodiment: example in which power supply wiring is formed below gate wiring of switching transistor)
3. Modification
4. Electronic device of the present disclosure
4-1. Specific example 1 (example of digital still camera)
4-2. Specific example 2 (example of head mounted display)
5. Configuration that the present disclosure can have <General Explanation of Display Device and Electronic Device of the Present Disclosure>

In a display device and an electronic device according to the present disclosure, a switching transistor can be configured to control a potential of an anode electrode of a light emitting unit to set the light emitting unit to a non-light emitting state.

In the display device and the electronic device of the present disclosure including the preferable configuration described above, a power supply wiring of a fixed potential can be formed over or below a gate wiring of the switching transistor.

Moreover, in the display device and the electronic device of the present disclosure having the preferable configuration described above, the another transistor can be a writing transistor for writing a video signal to the gate electrode of a driving transistor for driving the light emitting unit. Furthermore, in the pixels, processing for correcting variations in characteristics of the driving transistor can be performed during a non-light emitting period of the light emitting unit in which the switching transistor is in a conductive state.

Moreover, in the display device and the electronic device of the present disclosure having the preferable configuration described above, a substrate on which the pixels are two-dimensionally arranged can be a semiconductor substrate. Furthermore, the light emitting unit can include an organic electroluminescence element.

<Active Matrix Type Display Device>

The display device of the present disclosure is an active matrix type display device in which a current flowing through an electrooptic element is controlled by an active element provided in the same pixel circuit as the electrooptic element, for example, an insulated gate field effect transistor. As the insulated gate type field effect transistor, typically, a metal oxide semiconductor (MOS) transistor and a thin film transistor (TFT) can be exemplified.

Here, described as an example is an active matrix type organic EL display device using an organic EL element that is a current driven type electrooptic element whose light emission luminance changes according to a current value flowing in the device, as a light emitting unit (light emitting element) of a pixel circuit. Hereinafter, the "pixel circuit" may be simply described as "pixel".

[System Configuration]

FIG. 1 is a system configuration diagram schematically showing a configuration of the active matrix type organic EL display device of the present disclosure. As shown in FIG. 1, an organic EL display device 10 of the present disclosure includes a pixel array unit 30 in which a plurality of pixels 20 including organic EL elements are two-dimensionally arranged in a matrix, and a peripheral circuit unit arranged in a periphery of the pixel array unit 30. For example, the peripheral circuit unit includes a writing scanning unit 40 equipped on a display panel 70 that is the same as where the pixel array unit 30, a first driving scanning unit 50A, a second driving scanning unit 50B, a signal output unit 60, and the like, and drives each pixel 20 of the pixel array unit 30. Note that, any or all of the writing scanning unit 40, the first driving scanning unit 50A, the second driving scanning unit 50B, and the signal output unit 60 can be provided outside the display panel 70.

The organic EL display device 10 can be configured to be compatible with monochrome (black and white) display, or can be configured to be compatible with color display. In a case where the organic EL display device 10 is compatible with color display, one pixel (unit pixel/pixel) as a unit for forming a color image includes a plurality of sub pixels. At this time, each of the subpixels corresponds to the pixel 20 in FIG. 1. More specifically, in a display device compatible with color display, one pixel includes, for example, three sub pixels, that is, a sub pixel that emits red (R) light, a sub pixel that emits green (G) light, and a sub pixel that emits blue (B) light.

However, the one pixel is not limited to a combination of sub pixels of three primary colors of RGB, and it is also possible to form one pixel by further adding sub pixels of one or more colors to the sub pixels of three primary colors. More specifically, for example, in order to improve the luminance, a sub pixel emitting white (W) light can be added to form one pixel, or at least one sub pixel emitting complementary color light for enlarging the color reproduction range can be added to form one pixel.

In the pixel array unit 30, scanning lines 31 ($31_1$ to $31_m$), first driving lines 32 ($32_1$ to $32_m$), and second driving lines 33 ($33_1$ to $33_m$) are wired for each pixel row along the row direction (pixel array direction of pixel rows) with respect to the array of the pixels 20 of m rows and n columns. Moreover, signal lines 34 ($34_1$ to $34_n$) are wired for each pixel column along the column direction (pixel array direction of pixel columns) with respect to the array of the pixels 20 of m rows and n columns.

The scanning lines $31_1$ to $31_m$ are respectively connected to output ends of the corresponding rows of the writing scanning unit 40. The first driving lines $32_1$ to $32_m$ are respectively connected to output ends of the corresponding rows of the first driving scanning unit 50A. The second driving lines $33_1$ to $33_m$ are respectively connected to output ends of the corresponding rows of the second driving scanning unit 50B. The signal lines $34_1$ to $34_n$ are respectively connected to output ends of the corresponding columns of the signal output unit 60.

The writing scanning unit 40 includes a shift register circuit or the like. When writing a signal voltage of a video signal to each pixel 20 of the pixel array unit 30, the writing scanning unit 40 sequentially supplies writing scanning signals WS ($WS_1$ to $WS_m$) to the scanning lines 31 ($31_1$ to $31_m$), so that each pixel 20 of the pixel array unit 30 is sequentially scanned in units of row, that is, so-called line sequential scanning is performed.

As similar to the writing scanning unit 40, the first driving scanning unit 50A includes a shift register circuit or the like. In synchronization with the line sequential scanning by the writing scanning unit 40, the first driving scanning unit 50A supplies light emission control signals DS ($DS_1$ to $DS_m$) to the first driving lines 32 ($32_1$ to $32_m$) to control emission/non-emission (extinction) of the pixel 20.

As similar to the writing scanning unit 40, the second driving scanning unit 50B includes a shift register circuit or the like. In synchronization with the line sequential scanning by the writing scanning unit 40, the second driving scanning unit 50B supplies drive signals AZ ($AZ_1$ to $AZ_m$) to the second driving lines 33 ($33_1$ to $33_m$) to control the pixel 20 not to emit light in the non-light emitting period.

The signal output unit 60 selectively outputs a signal voltage (hereinafter, sometimes referred to simply as "signal voltage") $V_{sig}$ of a video signal corresponding to luminance information supplied from a signal supply source (not shown), and a reference voltage $V_{ofs}$. Here, the reference voltage $V_{ofs}$ is a voltage as a reference of the signal voltage $V_{sig}$ of the video signal (for example, a voltage corresponding to the black level of the video signal), or a voltage in the vicinity thereof. The reference voltage $V_{ofs}$ is used as an initialization voltage when correction operation as described later is performed.

The signal voltage $V_{sig}$/reference voltage $V_{ofs}$ alternatively output from the signal output unit 60 is written to each pixel 20 of the pixel array unit 30 via the signal lines 34 ($34_1$ to $34_n$) in units of pixel rows selected by line sequential scanning by the writing scanning unit 40. In other words, the signal output unit 60 adopts a line sequential writing drive mode in which the signal voltage $V_{sig}$ is written in units of pixel rows (lines).

[Pixel Circuit]

Figure 2:
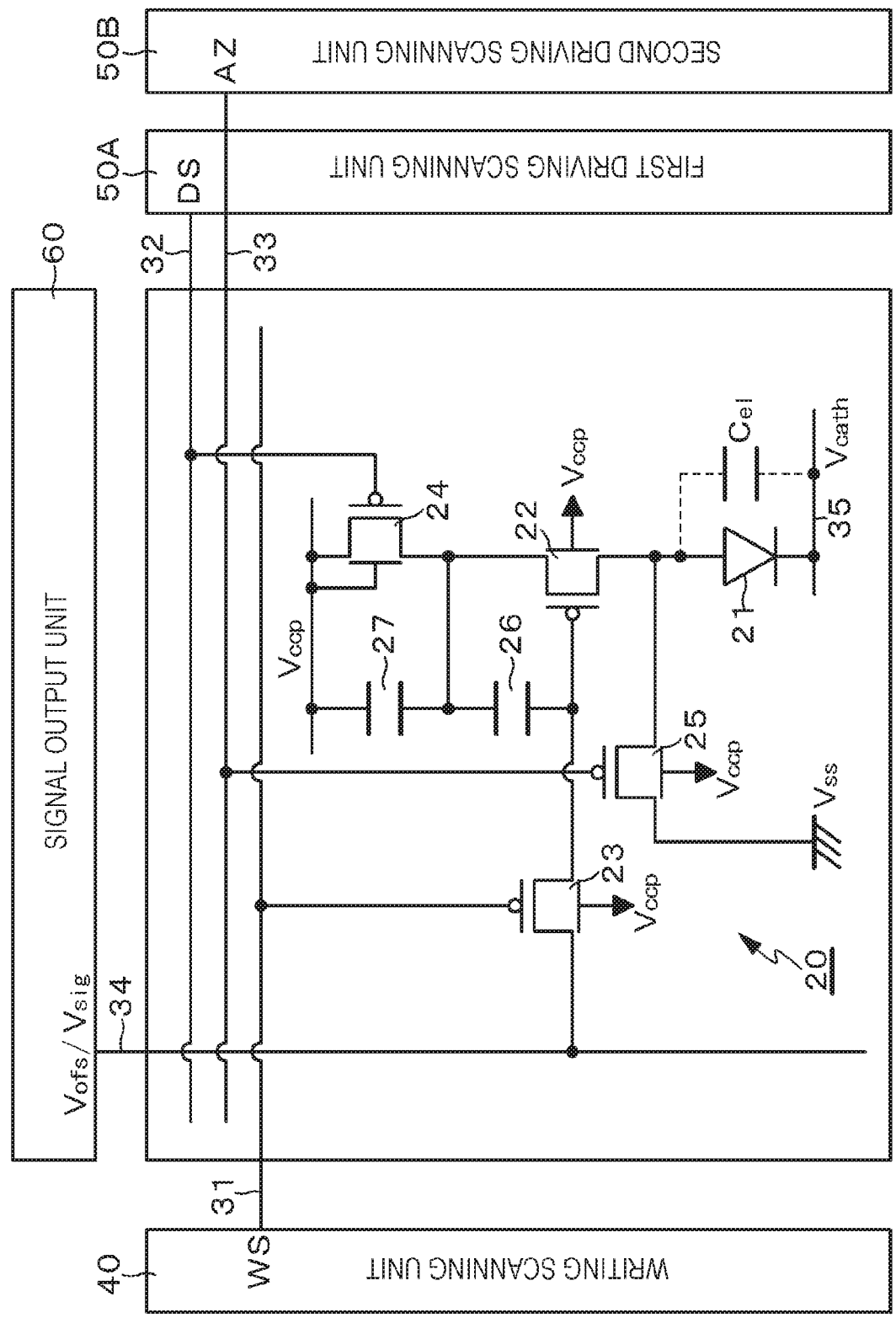
FIG. 2 is a circuit diagram showing an example of a circuit configuration of a pixel (pixel circuit) in the active matrix type organic EL display device of the present disclosure.

FIG. 2 is a circuit diagram showing an example of a circuit configuration of a pixel (pixel circuit) in the active matrix type organic EL display device 10 of the present disclosure. The light emitting unit of the pixel 20 includes an organic EL element 21. The organic EL element 21 is an example of a current driven type electrooptic element in which the light emission luminance changes according to a current value flowing in the device.

As shown in FIG. 2, the pixel 20 includes an organic EL element 21 and a drive circuit for driving the organic EL element 21 by applying a current to the organic EL element 21. In the organic EL element 21, a cathode electrode is connected to a common power supply line 35 wired in common for all the pixels 20.

The drive circuit for driving the organic EL element 21 has a configuration of a 4Tr (transistor)/2C (capacitor element) including a driving transistor 22, a writing transistor (sampling transistor) 23, a light emission control transistor 24, a switching transistor 25, a holding capacitor 26, and an auxiliary capacitor 27. Note that, in this example, the pixel (pixel circuit) 20 is formed not on an insulator such as a glass substrate but on a semiconductor such as silicon. In other words, the substrate on which the pixels 20 are two-dimensionally arranged is a semiconductor substrate. Then, the driving transistor 22 includes a p-channel type transistor.

Furthermore, in this example, the writing transistor 23, the light emission control transistor 24, and the switching transistor 25 also adopt a configuration using a p-channel type transistor as similar to the driving transistor 22. Accordingly, the driving transistor 22, the writing transistor 23, the light emission control transistor 24, and the switching transistor 25 do not have a configuration of three terminals, that is, source/gate/drain, but have a configuration of four terminals, that is, source/gate/drain/back gate. A power supply voltage $V_{ccp}$ on the high potential side is applied to the back gate of each transistor.

Each gate electrode of the writing transistor 23, the light emission control transistor 24, and the switching transistor 25 is connected to the scanning line 31, the first driving line 32, and the second driving line 33 formed along the row direction of the pixel array in units of pixel rows. Therefore, the scanning line 31, the first driving line 32, and the second driving line 33 can be referred to as the gate wirings of the light emission control transistor 24 and the switching transistor 25.

In the pixel 20 having the above configuration, the writing transistor 23 samples the signal voltage $V_{sig}$ supplied from the signal output unit 60 through the signal line 34 to write the signal voltage $V_{sig}$ to the gate electrode of the driving transistor 22. The light emission control transistor 24 is connected between the node of the power supply voltage $V_{ccp}$ and the source electrode of the driving transistor 22, and controls the light emission/non-light emission of the organic EL element 21 under the drive by the light emission control signal DS.

The switching transistor 25 is connected between an anode electrode of the organic EL element 21 and a power supply voltage $V_{ss}$ (for example, ground potential) on the low potential side, and is driven by the drive signal AZ so as to control the potential of the anode electrode of the organic EL element 21 to set the organic EL element 21 to a non-light emitting state. More specifically, the switching transistor 25 enters a conductive state in response to the drive signal AZ, thereby applying the power supply voltage $V_{ss}$ on the low potential side to the anode electrode of the organic EL element 21, to control the organic EL element 21 not to emit light during the non-light emitting period of the organic EL element 21.

The holding capacitor 26 is connected between the gate electrode and the source electrode of the driving transistor 22, and holds the signal voltage $V_{sig}$ written by sampling by the writing transistor 23. The driving transistor 22 applies a driving current corresponding to the holding voltage of the holding capacitor 26 to the organic EL element 21 to drive the organic EL element 21. The auxiliary capacitor 27 is connected between the source electrode of the driving transistor 22 and a node of a fixed potential (for example, a node of the power supply voltage $V_{ccp}$ on the high potential side). The auxiliary capacitor 27 has an action of suppressing the fluctuation of the source voltage of the driving transistor 22 when the signal voltage $V_{sig}$ is written, and an action of setting a gate-source voltage $V_{gs}$ of the driving transistor 22 to a threshold voltage $V_{th}$ of the driving transistor 22.

[Basic Circuit Behavior]

Here, the basic circuit behavior of the active matrix type organic EL display device 10 having the above configuration will be described with reference to the timing waveform diagram of FIG. 3.

The timing waveform diagram of FIG. 3 shows the changes of the light emission control signal DS, the writing scanning signal WS, the drive signal AZ, the potential $V_{ofs}/V_{sig}$ of the signal line 34, and the source voltage $V_s$ and the gate voltage $V_g$ of the driving transistor 22.

Note that, since the writing transistor 23, the light emission control transistor 24, and the switching transistor 25 are p-channel type transistors, the low level state of the writing scanning signal WS, the light emission control signal DS, and the drive signal AZ corresponds to an active state, and the high level state thereof corresponds to an inactive state. Then, the writing transistor 23, the light emission control transistor 24, and the switching transistor 25 enter a conductive state in the active state of the writing scanning signal WS, the light emission control signal DS, the drive signal AZ, and enter a non-conductive state in the inactive state thereof.

At time $t_1$, the writing scanning signal WS transits from the high level to the low level, so that the writing transistor 23 enters a conductive state. At this time, the reference voltage $V_{ofs}$ is in the state of being output from the signal output unit 60 to the signal line 34. Accordingly, since the reference voltage $V_{ofs}$ is written into the gate electrode of the driving transistor 22 by sampling by the writing transistor 23, the gate voltage $V_g$ of the driving transistor 22 becomes the reference voltage $V_{ofs}$.

Furthermore, at time $t_1$, since the light emission control signal DS is in the low level state, the light emission control transistor 24 is in a conductive state. Accordingly, the source voltage $V_s$ of the driving transistor 22 is the power supply voltage $V_{ccp}$ on the high potential side. At this time, the gate-source voltage $V_{gs}$ of the driving transistor 22 is $V_{gs}=V_{ofs}-V_{ccp}$.

Here, in order to perform threshold correction operation (threshold correction processing), it is necessary to make the gate-source voltage $V_{gs}$ of the driving transistor 22 larger than the threshold voltage $V_{th}$ of the driving transistor 22. Therefore, each voltage value is set so that $|V_{gs}|=|V_{ofs}-V_{ccp}|>|V_{th}|$ is satisfied.

In this manner, the initialization operation of setting the gate voltage $V_g$ of the driving transistor 22 to the reference voltage $V_{ofs}$ and setting the source voltage $V_s$ of the driving transistor 22 to the power supply voltage $V_{ccp}$ is operation of preparation before the next threshold correction operation is performed (preparation for threshold correction). Accordingly, the reference voltage $V_{ofs}$ and the power supply voltage $V_{ccp}$ are initialization voltages of the gate voltage $V_g$ and the source voltage $V_s$ of the driving transistor 22.

Next, at time $t_2$, when the light emission control signal DS transits from the low level to the high level, and the light emission control transistor 24 enters the non-conductive state, the source electrode of the driving transistor 22 enters a floating state, and the threshold correction operation is started in a state where the gate voltage $V_g$ of the driving transistor 22 is kept at the reference voltage $V_{ofs}$. In other words, the source voltage $V_s$ of the driving transistor 22 starts decreasing (being reduced) toward the voltage obtained by subtracting the threshold voltage $V_{th}$ from the gate voltage $V_g$ of the driving transistor 22 ($V_g-V_{th}$).

In the basic operation, with the initialization voltage $V_{ofs}$ of the gate voltage $V_g$ of the driving transistor 22 taken as a reference, the operation of changing the source voltage $V_s$ of the driving transistor 22 toward the voltage obtained by subtracting the threshold voltage $V_{th}$ of the driving transistor 22 from the initialization voltage $V_{ofs}$ ($V_g-V_{th}$) is the threshold correcting operation. As the threshold correction operation progresses, the gate-source voltage $V_{gs}$ of the driving transistor 22 eventually converges to the threshold voltage $V_{th}$ of the driving transistor 22. A voltage corresponding to this threshold voltage $V_{th}$ is held in the holding capacitor 26.

Then, at time $t_3$, the writing scanning signal WS transits from the low level to the high level, and when the writing transistor 23 enters a non-conductive state, the threshold correction period ends. Thereafter, at time $t_4$, the signal voltage $V_{sig}$ of the video signal is output from the signal output unit 60 to the signal line 34, and the potential of the signal line 34 is switched from the reference voltage $V_{ofs}$ to the signal voltage $V_{sig}$.

Next, at time $t_5$, the writing scanning signal WS transits from the high level to the low level, so that the writing transistor 23 enters a conductive state, samples the signal voltage $V_{sig}$, and writes the signal voltage $V_{sig}$ in the pixel 20. By the writing operation of the signal voltage $V_{sig}$ by the writing transistor 23, the gate voltage $V_g$ of the driving transistor 22 enters the signal voltage $V_{sig}$.

The auxiliary capacitor 27 connected between the source electrode of the driving transistor 22 and the node of the power supply voltage $V_{ccp}$ has an action of suppressing the fluctuation of the source voltage $V_s$ of the driving transistor 22 at the time of writing of the signal voltage $V_{sig}$ of this video signal. Then, when the driving transistor 22 is driven by the signal voltage $V_{sig}$ of the video signal, the threshold voltage $V_{th}$ of the driving transistor 22 is canceled out by the voltage corresponding to the threshold voltage $V_{th}$ held in the holding capacitor 25.

At this time, the gate-source voltage $V_{gs}$ of the driving transistor 22 opens (increases) according to the signal voltage $V_{sig}$, but the source voltage $V_s$ of the driving transistor 22 is still in a floating state. Therefore, the charged electric charge of the holding capacitor 26 is discharged according to the characteristics of the driving transistor 22. Then, at this time, the current flowing through the driving transistor 22 starts charging an equivalent capacitance $C_{el}$ of the organic EL element 21.

As the equivalent capacitance $C_{el}$ of the organic EL element 21 is charged, the source voltage $V_s$ of the driving transistor 22 gradually decreases as time elapses. At this time, the variation of the threshold voltage $V_{th}$ of the driving transistor 22 for each pixel has already been canceled, and the drain-source current $I_{ds}$ of the driving transistor 22 is dependent on mobility μ of the driving transistor 22. Note that the mobility μ of the driving transistor 22 is the mobility of the semiconductor thin film forming the channel of the driving transistor 22.

Here, the descending portion of the source voltage $V_s$ of the driving transistor 22 acts to discharge the charged electric charge of the holding capacitor 26. In other words, a negative feedback is applied to the holding capacitor 26 for the amount of the descending portion (change amount) of the source voltage $V_s$ of the driving transistor 22. Accordingly, the descending portion of the source voltage $V_s$ of the driving transistor 22 is the feedback amount of the negative feedback.

In this manner, negative feedback is applied to the holding capacitor 26 with a feedback amount corresponding to the drain-source current $I_{ds}$ flowing through the driving transistor 22, so that the dependence on the mobility μ of the drain-source current $I_{ds}$ of the driving transistor 22 can be cancelled. This canceling operation (canceling processing) is mobility correction operation (mobility correction processing) for correcting the variation of the mobility μ of the driving transistor 22 for each pixel.

More specifically, since the drain-source current $I_{ds}$ increases as signal amplitude $V_{in}$ ($=V_{sig}-V_{ofs}$) of the video signal written to the gate electrode of the driving transistor 22 increases, the absolute value of the feedback amount of the negative feedback also increases. Accordingly, mobility correction processing is performed according to the signal amplitude $V_{in}$ of the video signal, in other words, the light emission luminance level. Furthermore, in a case where the signal amplitude $V_{in}$ of the video signal is constant, as the mobility μ of the driving transistor 22 is larger, the absolute value of the feedback amount of the negative feedback is also larger, so that it is possible to eliminate the variation in the mobility μ for each pixel.

At time $t_6$, the writing scanning signal WS transits from the low level to the high level, and the writing transistor 23 enters a non-conductive state, so that the signal write and mobility correction period ends. After the mobility correction is performed, at time $t_7$, the light emission control signal DS transits from the high level to the low level, so that the light emission control transistor 24 enters the conductive state. As a result, a current is supplied from the power supply voltage $V_{ccp}$ node to the driving transistor 22 through the light emission control transistor 24.

At this time, since the writing transistor 23 is in the non-conductive state, so that the gate electrode of the driving transistor 22 is electrically disconnected from the signal line 34 and is in a floating state. Here, when the gate electrode of the driving transistor 22 is in a floating state, since the holding capacitor 26 is connected between the gate and the source of the driving transistor 22, the gate voltage $V_g$ also fluctuates in conjunction with the fluctuation of the source voltage $V_s$ of the driving transistor 22.

In other words, the source voltage $V_s$ and the gate voltage $V_g$ of the driving transistor 22 rise while holding the gate-source voltage $V_{gs}$ held in the holding capacitor 26. Then, the source voltage $V_s$ of the driving transistor 22 rises to the light emission voltage $V_{oled}$ of the organic EL element 21 according to the saturation current of the transistor.

In this manner, the operation in which the gate voltage $V_g$ of the driving transistor 22 fluctuates in conjunction with the fluctuation of the source voltage $V_s$ is bootstrap operation. In other words, the bootstrap operation is operation in which, while the gate-source voltage $V_{gs}$ held in the holding capacitor 26, that is, the voltage across the holding capacitor 26 is held, the gate voltage $V_g$ and the source voltage $V_s$ of the driving transistor 22 fluctuate.

Then, the drain-source current $I_{ds}$ of the driving transistor 22 starts flowing to the organic EL element 21, so that the anode voltage $V_{ano}$ of the organic EL element 21 rises according to the current $I_{ds}$. Eventually, when the anode voltage $V_{ano}$ of the organic EL element 21 exceeds the threshold voltage $V_{thel}$ of the organic EL element 21, a driving current starts to flow to the organic EL element 21, so that the organic EL element 21 starts emitting light.

On the other hand, the second driving scanning unit 50B sets the drive signal AZ to the active state (low level state) in the period from time $t_0$ that is before time $t_1$, to time $t_0$ that is after time $t_7$. The period from time $t_0$ to time $t_8$ is the non-light emitting period of the organic EL element 21. In this non-light emitting period, the drive signal AZ becomes active, so that the switching transistor 25 enters a conductive state in response thereto.

When the switching transistor 25 enters a conductive state, the power supply voltage $V_{ss}$ on the low potential side is applied to the anode electrode (the drain electrode of the driving transistor 22) of the organic EL element 21 via the switching transistor 25. As a result, in the non-light emitting period of the organic EL element 21, the switching transistor 25 can control the organic EL element 21 not to emit light. Incidentally, in one horizontal period (1H) in which threshold correction and signal writing are performed, the drive signal AZ becomes active, but in the subsequent light emitting period, the drive signal AZ becomes inactive.

Here, attention is paid to the operation point from the threshold correction preparation period to the threshold correction period (time $t_1$ to time $t_3$) in the pixel configuration not having the switching transistor 25. As is clear from the above explanation of the operation, in order to perform the threshold correction operation, it is necessary to make the gate-source voltage $V_{gs}$ of the driving transistor 22 larger than the threshold voltage $V_{th}$ of the driving transistor 22.

When the gate-source voltage $V_{gs}$ is larger than the threshold voltage $V_{th}$, a current flows through the driving transistor 22. Then, the anode voltage $V_{ano}$ of the organic EL element 21 temporarily exceeds the threshold voltage $V_{thel}$ of the organic EL element 21 from the threshold correction preparation period to a part of the threshold correction period. As a result, since a current flows from the driving transistor 22 to the organic EL element 21, regardless of the non-light emitting period, the organic EL element 21 emits light at constant luminance for each frame regardless of the gradation of the signal voltage $V_{sig}$. As a result, the contrast of the display panel 70 is lowered.

On the other hand, in the pixel configuration having the switching transistor 25, the above described action of the switching transistor 25 can prevent the current flowing through the driving transistor 22 from flowing into the organic EL element 21 during the non-light emitting period of the organic EL element 21. This makes it possible to suppress light emission of the organic EL element 21 in the non-light emitting period, so that it is possible to achieve a higher contrast of the display panel 70 than a pixel configuration not having the switching transistor 25.

In the series of basic circuit behavior described above, each operation (processing) of threshold correction, writing (signal writing) of the signal voltage $V_{sig}$ of the video signal, and mobility correction is performed in one horizontal period (1H), for example. More specifically, in one horizontal period, each operation is performed in a period $t_0$-$t_8$ in which the drive signal AZ enters an active state (low level state) and the switching transistor 25 enters a conductive state, in other words, in a non-light emitting period of the organic EL element 21.

[Parasitic Capacitance Between Wirings]

In the above-described active matrix type organic EL display device 10, gate wirings of the writing transistor 23, the light emission control transistor 24, and the switching transistor 25, in other words, the scanning line 31, the first driving line 32, and the second driving line 33 are formed along the row direction of the pixel array as described above.

Here, as the number of pixels increases with higher definition, the interval between the pixels 20 becomes smaller. Furthermore, in a microdisplay (ultra-compact display device), as a matter of course, the interval between the pixels 20 is smaller than that in a general display for application as a monitor. As described above, when the interval between the pixels 20 becomes smaller, the parasitic capacitance formed along the row direction of the pixel array and occurring between adjacent gate wirings cannot be disregarded.

(Example in which Adjacent Gate Wirings are Formed in the Same Wiring Layer)

Figure 4A:
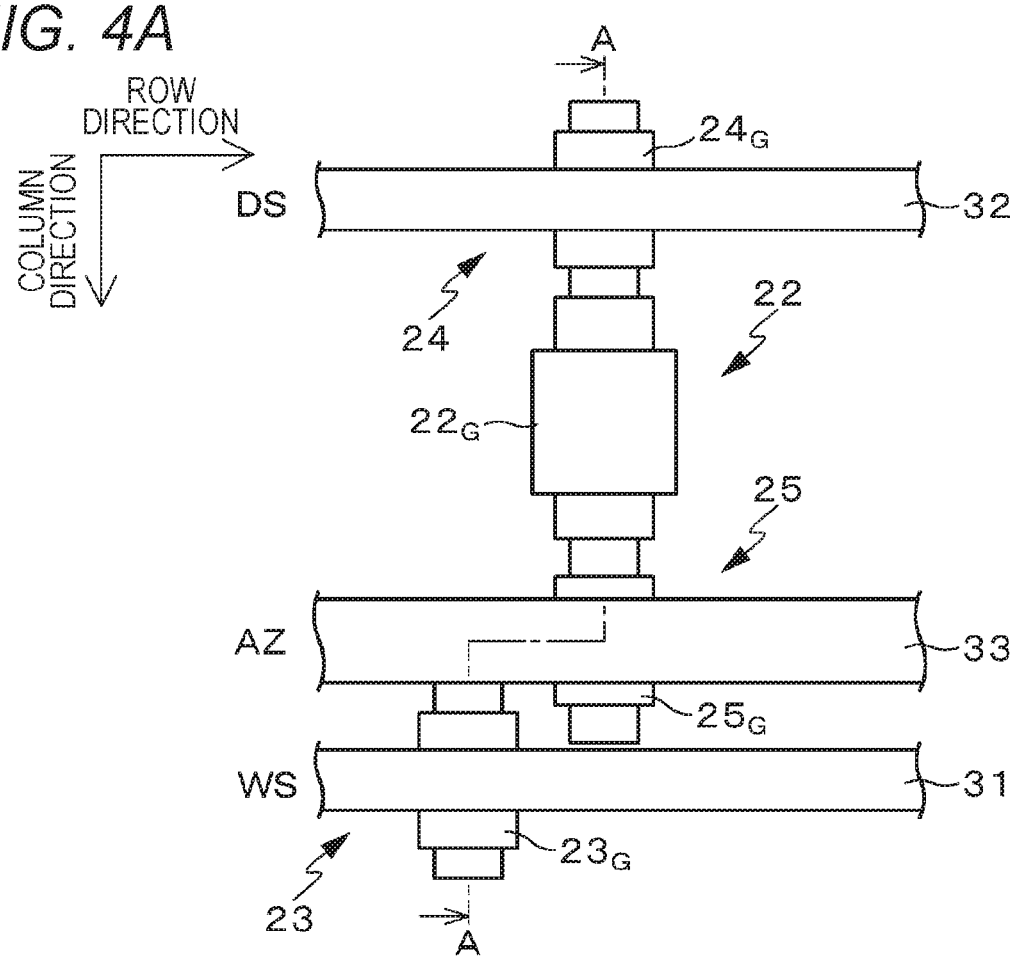
FIG. 4A is a plan view showing a gate wiring structure according to a conventional example.
Figure 4B:
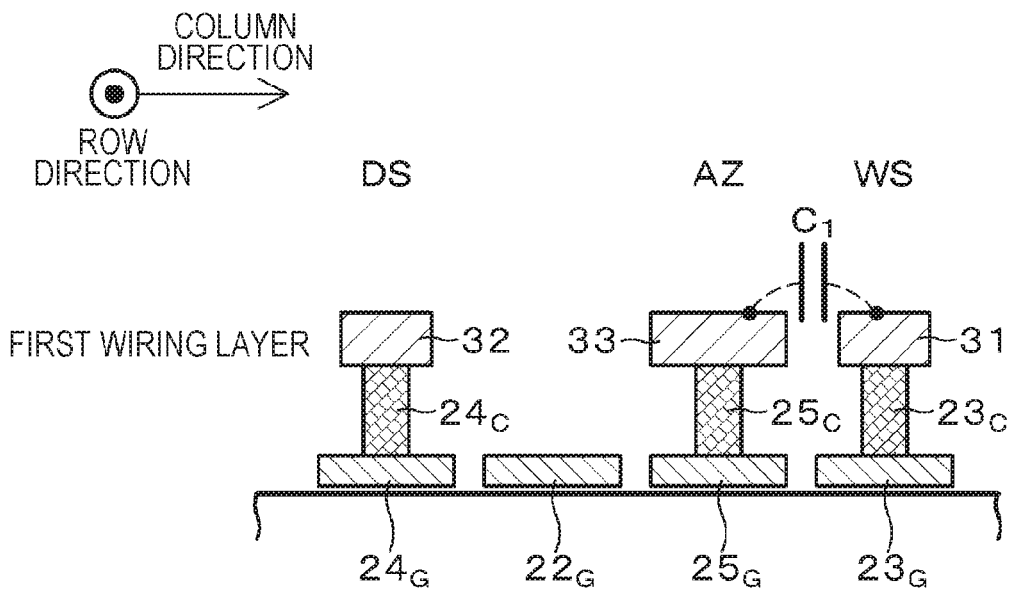
FIG. 4B is a cross-sectional view taken along line A-A of FIG. 4A.

Here, a case where gate wirings of the writing transistor 23, the light emission control transistor 24, and the switching transistor 25 are formed in the same wiring layer will be considered as a conventional example. FIG. 4A is a plan view of the gate wiring structure of the writing transistor 23, the light emission control transistor 24, and the switching transistor 25 according to the conventional example, and FIG. 4B is a cross-sectional view taken along line A-A of FIG. 4A.

Regarding the driving transistor 22, the first driving line 32 that is a gate wiring of the light emission control transistor 24, is formed on one side of the driving transistor 22, and the scanning line 31 that is a gate wiring of the writing transistor 23, and the second driving line 33 that is a gate wiring of the switching transistor 25 are formed on the other side of the driving transistor 22, along the row direction. The first driving line 32, the scanning line 31, and the second driving line 33 are all formed in the first wiring layer, in other words, in the same wiring layer.

To the first driving line 32, a gate electrode $24_G$ of the light emission control transistor 24 is connected by a contact $24_C$. To the scanning line 31, a gate electrode $23_G$ of the writing transistor 23 is connected by a contact $23_C$. To the second driving line 33, a gate electrode $25_G$ of the switching transistor 25 is connected by a contact $25_C$.

In the gate wiring structure described above, the scanning line 31 and the second driving line 33 are formed adjacent to each other and parallel along the row direction. Therefore, when the interval between the pixels 20 becomes small, the capacitance value of the parasitic capacitance $C_1$ between the gate wirings increases. Here, the switching transistor 25 having the second driving line 33 as a gate wiring is connected to the anode electrode of the organic EL element 21 (see FIG. 2). Accordingly, when the potential of the second driving line 33 fluctuates by coupling due to the parasitic capacitance $C_1$ in the potential fluctuation of the scanning line 31 that is an adjacent gate wiring, potential fluctuation of the second driving line 33 adversely affects the light emitting operation of the organic EL element 21, which may cause display unevenness.

First Embodiment

Figure 5A:
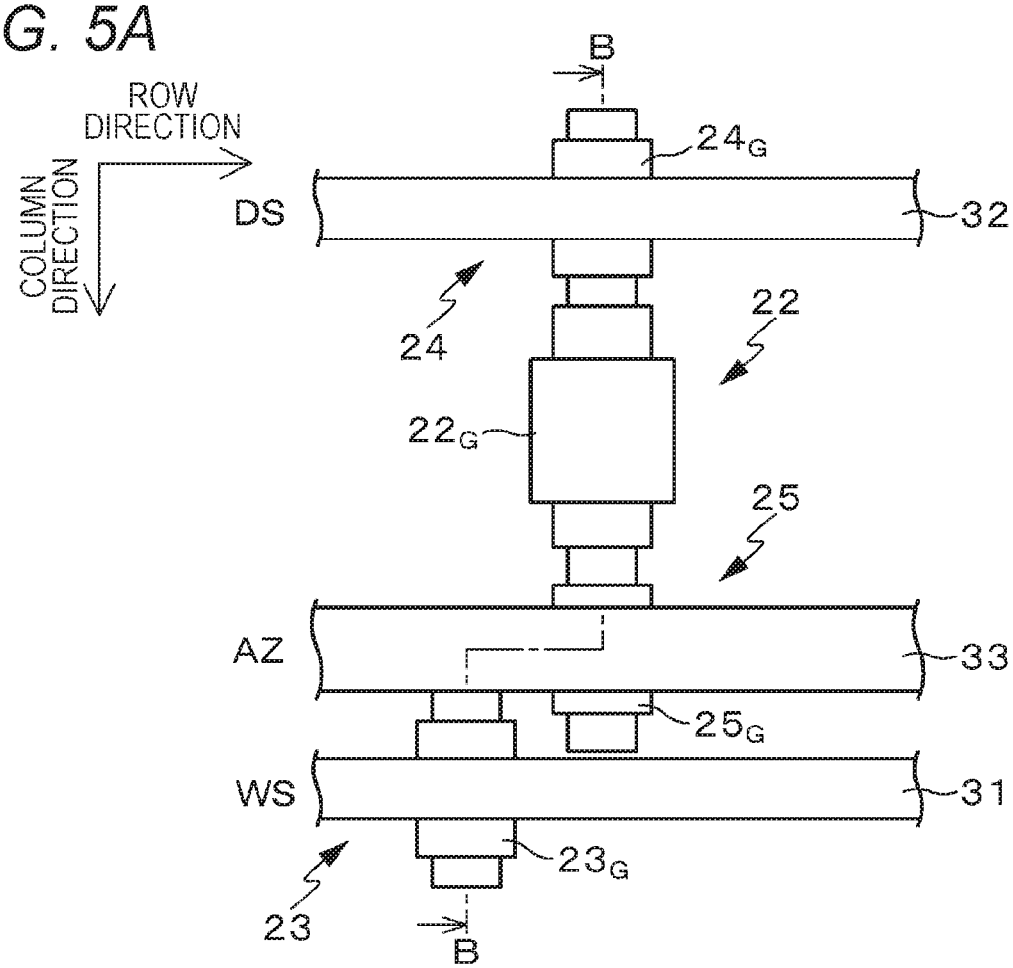
FIG. 5A is a plan view showing a gate wiring structure according to a first embodiment.
Figure 5B:
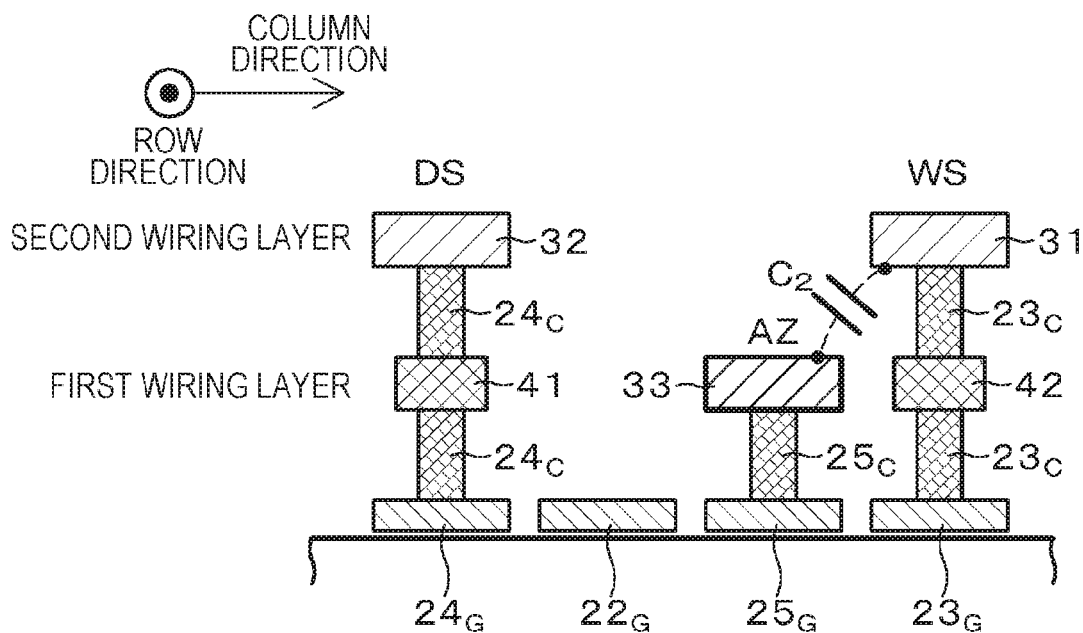
FIG. 5B is a cross-sectional view taken along line B-B of FIG. 5A.

A first embodiment is example in which the gate wiring of the switching transistor 25 is formed in the wiring layer different from a gate wiring of another transistor. FIG. 5A is a plan view of the gate wiring structure of the writing transistor 23, the light emission control transistor 24, and the switching transistor 25 according to the first embodiment, and FIG. 5B is a cross-sectional view taken along line B-B of FIG. 5A.

In the gate wiring structure according to the first embodiment, the second driving line 33 that is the gate wiring of the switching transistor 25 is formed in the first wiring layer, the scanning line 31 and the first driving line 32 that are the gate wirings of the writing transistor 23 and the light emission control transistor 24, respectively, are formed in the second wiring layer.

Then, the gate electrode $24_G$ of the light emission control transistor 24 is connected to the first driving line 32 formed in the second wiring layer by the contact $24_C$ via an island shaped relay electrode 41 formed in the first wiring layer. Similarly, the gate electrode $23_G$ of the writing transistor 23 is connected to the scanning line 31 formed in the second wiring layer by the contact $23_C$ via an island shaped relay electrode 4142 formed in the first wiring layer.

Note that, although the gate wiring structure in which both the scanning line 31 and the first driving line 32 are formed in the second wiring layer has been illustrated here, any gate wiring structures may be used as long as the scanning line 31 adjacent to at least the second driving line 33 is formed in the second wiring layer. Furthermore, the gate wiring structure may be a structure in which the second driving line 33 is formed in the second wiring layer, and the scanning line 31, or the scanning line 31 and the first driving line 32 are formed in the first wiring layer.

In this way, the second driving line 33 that is the gate wiring of the switching transistor 25 is formed in a wiring layer different from the adjacent scanning line 31, so that a wiring interval between the second driving line 33 and the scanning line 31 are larger than that in a case where both gate wirings are formed in the same wiring layer. Accordingly, a parasitic capacitance $C_2$ generated between the second driving line 33 and the scanning line 31 can be reduced as compared with the parasitic capacitance $C_1$ in a case where both gate wirings are formed in the same wiring layer. As a result, when the potential of the scanning line 31 fluctuates, the influence of coupling due to the parasitic capacitance $C_2$ to the second driving line 33 from the scanning line 31 can be suppressed, so that it is possible to suppress the display unevenness caused by the fluctuation of the potential of the second driving line 33 generated by coupling noise or the like.

Second Embodiment

Figure 6A:
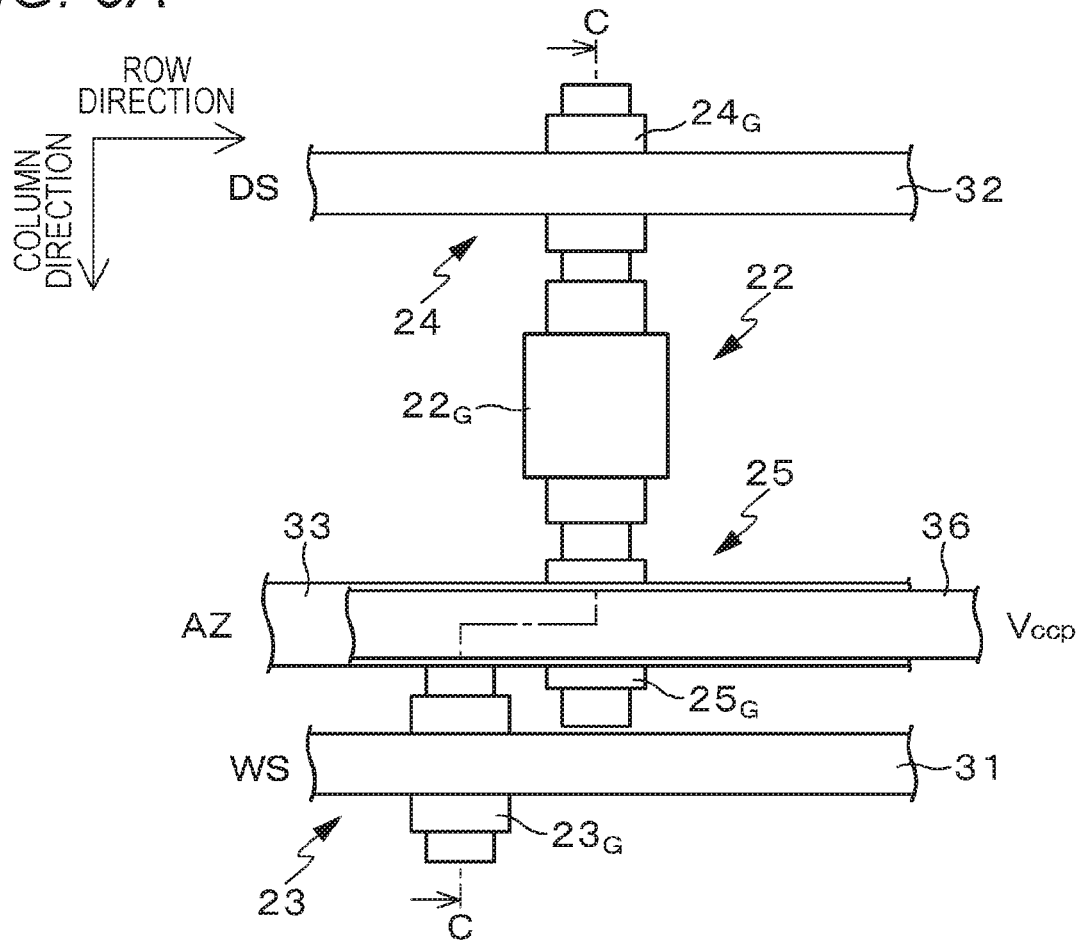
FIG. 6A is a plan view showing a gate wiring structure according to a second embodiment.
Figure 6B:
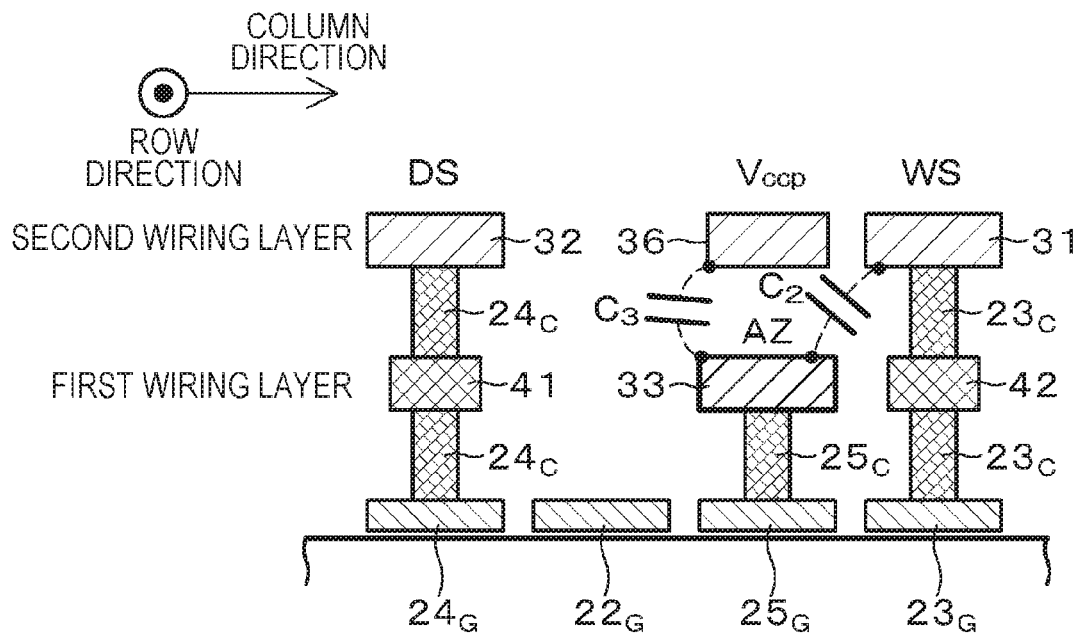
FIG. 6B is a cross-sectional view taken along line C-C of FIG. 6A.

A second embodiment is a modification of the first embodiment, and is an example in which power supply wiring of a fixed potential is formed over the second driving line 33 that is the gate wiring of the switching transistor 25. FIG. 6A is a plan view of the gate wiring structure of the writing transistor 23, the light emission control transistor 24, and the switching transistor 25 according to the second embodiment, and FIG. 6B is a cross-sectional view taken along line C-C of FIG. 6A.

In the gate wiring structure according to the second embodiment, the second driving line 33 that is the gate wiring of the switching transistor 25 is formed in a wiring layer different from the adjacent scanning line 31, and then a power supply wiring 36 of the power supply voltage $V_{ccp}$ is formed over the second driving line 33 (in this embodiment, the second wiring layer). As a result, a parasitic capacitance $C_3$ is formed between the second driving line 33 and the power supply wiring 36 over the second driving line 33.

According to the gate wiring structure according to the second embodiment, as similar to the case of the first embodiment, in addition to being able to suppress the influence of the coupling due to the parasitic capacitance $C_2$ with respect to the second driving line 33 from the scanning line 31, the potential of the second driving line 33 can be further stabilized by the action of the parasitic capacitance $C_3$. As a result, the potential of the second driving line 33 can be made less susceptible to influence from other gate wirings, so that display unevenness due to the fluctuation of the potential of the second driving line 33 can be suppressed.

Third Embodiment

Figure 7A:
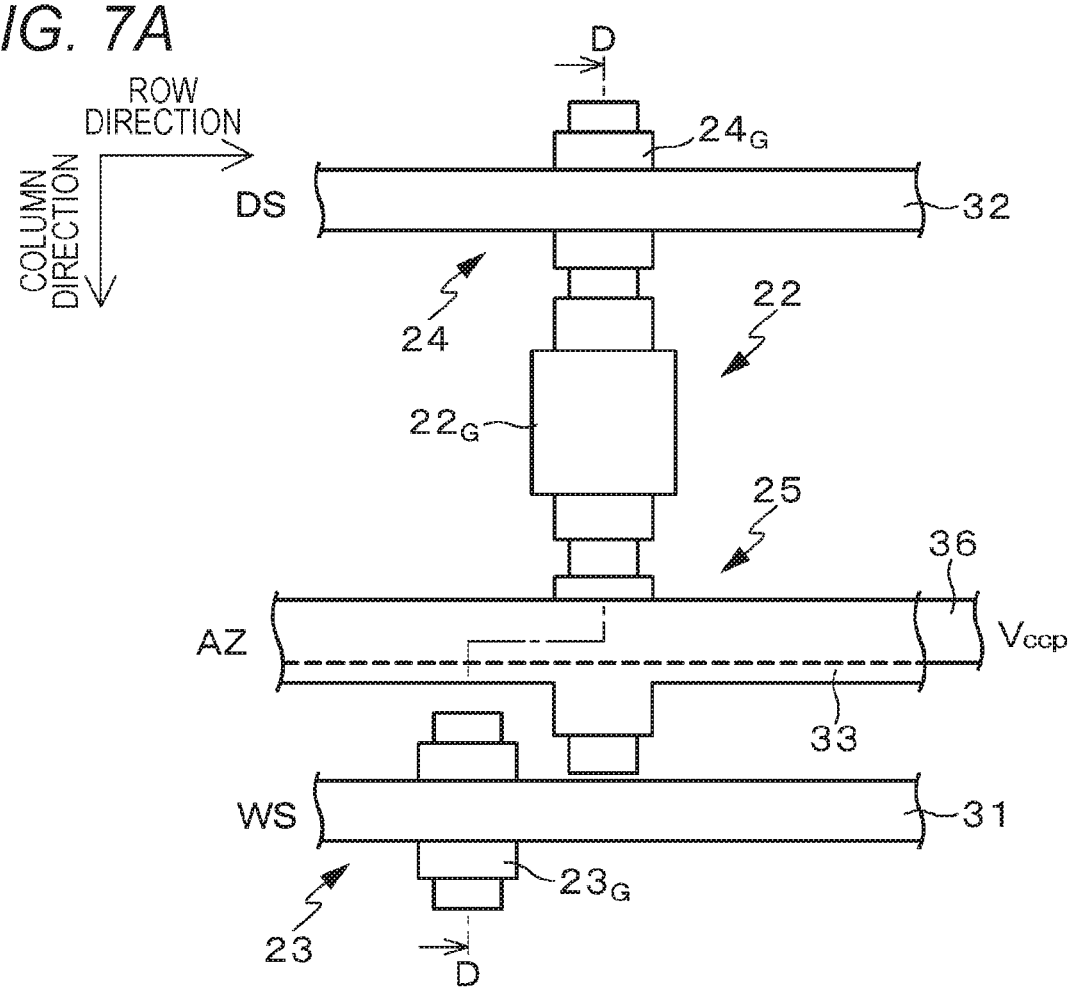
FIG. 7A is a plan view showing a gate wiring structure according to a third embodiment.
Figure 7B:
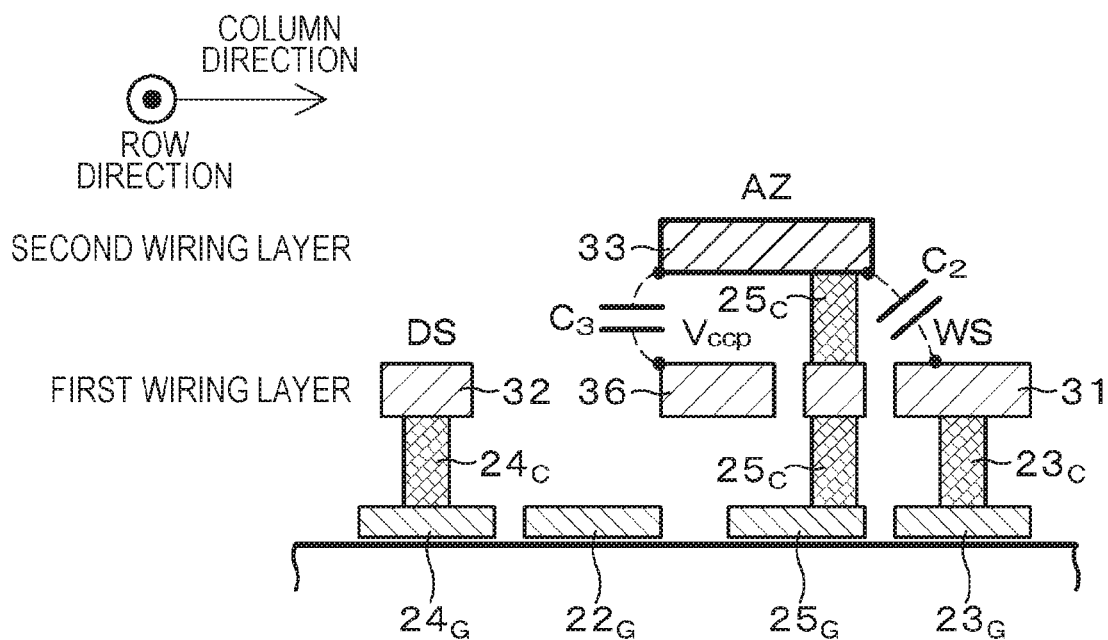
FIG. 7B is a cross-sectional view taken along line D-D of FIG. 7A.

A third embodiment is a modification of the third embodiment, and is an example in which a power supply wiring of a fixed potential is formed below the second driving line 33 that is the gate wiring of the switching transistor 25. FIG. 7A is a plan view of the gate wiring structure of the writing transistor 23, the light emission control transistor 24, and the switching transistor 25 according to the third embodiment, and FIG. 7B is a cross-sectional view taken along line D-D of FIG. 7A.

In the gate wiring structure according to the third embodiment, the second driving line 33 that is the gate wiring of the switching transistor 25 is formed in a wiring layer different from the adjacent scanning line 31, and then a power supply wiring 36 of the power supply voltage $V_{ccp}$ is formed below the second driving line 33 (in this embodiment, the first wiring layer). As a result, a parasitic capacitance $C_3$ is formed between the second driving line 33 and the power supply wiring 36 below the second driving line 33.

With the gate wiring structure according to the third embodiment, similar operation and effect to those in the case of the second embodiment can be obtained. In other words, as similar to the case of the first embodiment, in addition to being able to suppress the influence of the coupling due to the parasitic capacitance $C_2$ with respect to the second driving line 33 from the scanning line 31, the potential of the second driving line 33 can be further stabilized by the action of the parasitic capacitance $C_3$. As a result, the potential of the second driving line 33 can be made less susceptible to influence from other gate wirings, so that display unevenness due to the fluctuation of the potential of the second driving line 33 can be suppressed.

<Modification>

Although the technology of the present disclosure has been described above on the basis of the preferred embodiments, the technique of the present disclosure is not limited to the embodiments. The configuration and structure of the display device described in each of the above embodiments are illustrative and can be changed as appropriate. For example, in each of the above embodiments, the gate wiring (scanning line 31) of the writing transistor 23 is exemplified as the gate wiring of another transistor, but the gate wiring of another transistor is not limited thereto. For example, in the pixel circuit shown in FIG. 2, the gate wiring (first driving line 32) of the light emission control transistor 24 can be used as the gate wiring of another transistor.

<Electronic Device of the Present Disclosure>

The display device according to the present disclosure described above can be used as a display unit (display device) of an electronic device in any fields that displays a video signal input to an electronic device or a video signal generated in the electronic device as an image or video. Examples of the electronic device can include a television set, a notebook personal computer, a digital still camera, a mobile terminal device such as a mobile phone, a head mount display, and the like. However, the electronic device is not limited to these.

As described above, the following effects can be obtained by using the display device of the present disclosure as a display unit in electronic devices of any fields. In other words, according to the display device of the present disclosure, it is possible to suppress display unevenness caused by the fluctuation of the potential of the gate wiring of the switching transistor 25. Accordingly, the display device of the present disclosure is used as a display unit (display device) of the electronic device, and thereby, the display quality of the display image can be improved.

The display device of the present disclosure also includes a module shape of a sealed configuration. Examples of such a display device include a display module formed by affixing a facing unit such as transparent glass to a pixel array unit. Note that the display module may be provided with a circuit unit for inputting and outputting a signal or the like from the outside to the pixel array unit, a flexible printed circuit (FPC), or the like. Hereinafter, a digital still camera and a head mounted display will be exemplified as specific examples of the electronic device using the display device of the present disclosure. However, the specific examples illustrated here are merely examples, and the present invention is not limited thereto.

Specific Example 1

Figure 8A:
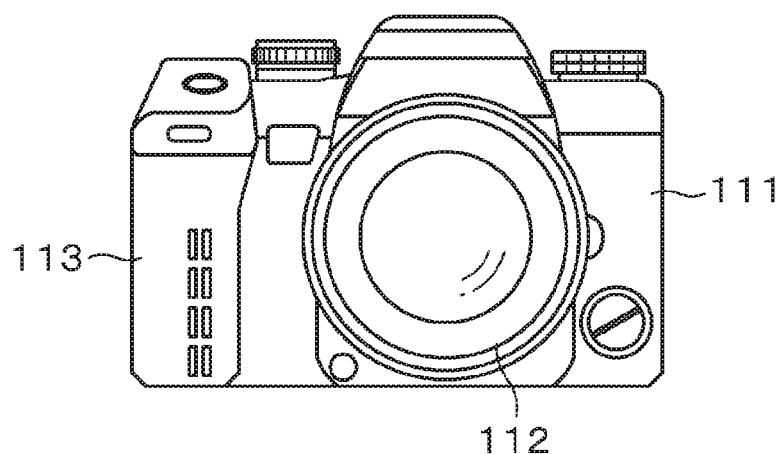
FIG. 8A and FIG. 8B are a front view and a rear view of a lens interchangeable single lens reflex type digital still camera.
Figure 8B:
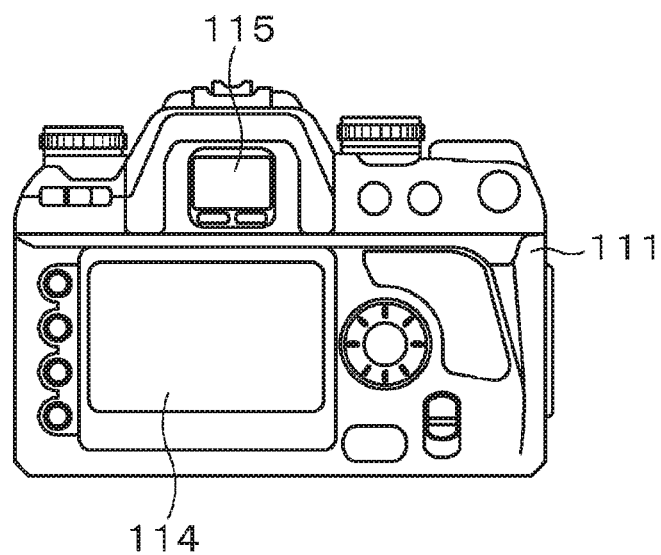

FIG. 8 is an external view of a lens interchangeable single lens reflex type digital still camera, FIG. 8A is a front view thereof, and FIG. 8B is a rear view thereof. A lens interchangeable single lens reflex type digital still camera has, for example, an interchangeable photographic lens unit (interchangeable lens) 112 on the front right side of a camera body unit (camera body) 111, and a grip unit 113 that is gripped by a photographer on the front left side.

Then, a monitor 114 is provided substantially at the center of the rear surface of the camera body unit 111. An electronic view finder (eyepiece window) 115 is provided on the upper portion of the monitor 114. By looking into an electronic view finder 115, the photographer can visually recognize an optical image of a subject introduced from the photographing lens unit 112 and determine the composition.

In the lens interchangeable single lens reflex type digital still camera having the above configuration, the display device of the present disclosure can be used as the electronic view finder 115. In other words, the lens interchangeable single lens reflex type digital still camera according to the present example is manufactured by using the display device of the present disclosure as the electronic view finder 115.

Specific Example 2

Figure 9:
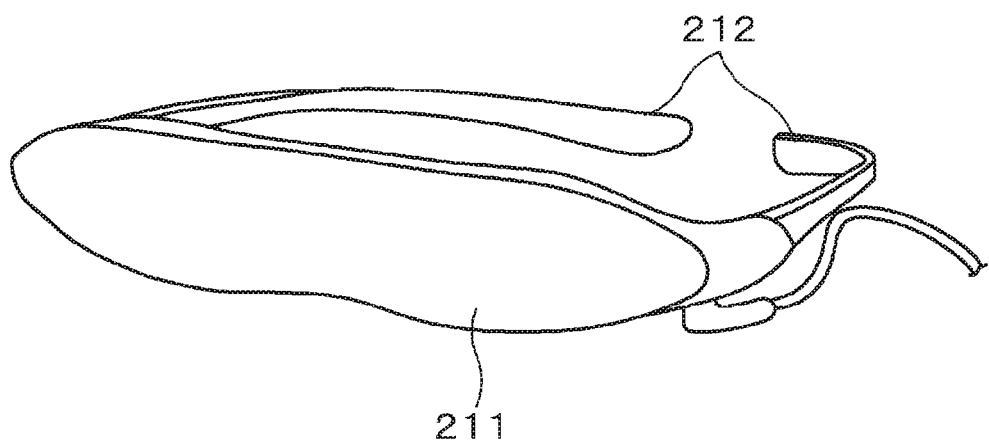
FIG. 9 is an external view of a head mounted display.

FIG. 9 is an external view of a head mounted display. The head mount display has, for example, an ear hanger 212 worn in the head of a user, on both sides of a glasses-shaped display unit 211. In this head mounted display, the display device of the present disclosure can be used as the display unit 211. In other words, the head mounted display according to the present example is manufactured by using the display device of the present disclosure as the display unit 211.

<Configuration that the Present Disclosure can Have>

Note that, the present disclosure can also have the following configuration.

[1] A display device including:

pixels including a light emitting unit and a plurality of transistors, the pixels being two-dimensionally arranged in a matrix; and gate wirings of the plurality of transistors formed along a row direction of a pixel array, in which, among the plurality of transistors, a gate wiring of a switching transistor connected to an anode electrode of the light emitting unit is formed in a wiring layer different from a gate wiring of another transistor.

[2] The display device described in [1] above, in which the switching transistor controls a potential of the anode electrode of the light emitting unit to set the light emitting unit to a non-light emitting state.

[3] The display device described in [1] or [2] above, in which a power supply wiring of a fixed potential is formed over or below the gate wiring of the switching transistor.

[4] The display device described in any of [1] to [3] above, in which the another transistor is a writing transistor for writing a video signal with respect to a gate electrode of a driving transistor that drives the light emitting unit.

[5] The display device described in [4] above, in which, in the pixels, processing for correcting variations in characteristics of the driving transistor is performed during a non-light emitting period of the light emitting unit in which the switching transistor is in a conductive state.

[6] The display device described in any of [1] to [5] above, in which a substrate on which the pixels are two-dimensionally arranged is a semiconductor substrate.

[7] The display device described in any of [1] to [6] above, in which the light emitting unit includes an organic electroluminescence element.

[8] An electronic device including a display device, the display device including:

pixels including a light emitting unit and a plurality of transistors and two-dimensionally arranged in a matrix; and gate wirings of the plurality of transistors formed along a row direction of a pixel array, in which, among the plurality of transistors, a gate wiring of a switching transistor connected to an anode electrode of the light emitting unit is formed in a wiring layer different from a gate wiring of another transistor.

REFERENCE SIGNS LIST

10 Organic EL display device
20 Pixel (pixel circuit)
21 Organic EL element
22 Driving transistor
23 Writing transistor
24 Light emission control transistor
25 Switching transistor
26 Holding capacitor
27 Auxiliary capacitor
30 Pixel array unit
31 ($31_1$ to $31_m$) Scanning line
32 ($32_1$ to $32_m$) First driving line
33 ($33_1$ to $33_m$) Second driving line
34 ($34_1$ to $34_n$) Signal line
35 Common power supply line
36 Power wiring
40 Writing scanning unit
50A First driving scanning unit
50B Second driving scanning unit
60 Signal output unit
70 Display panel

The invention claimed is:

1. A display device comprising:
pixels two-dimensionally arranged in a pixel array including a row direction and a column direction, at least one of the pixels including a light emitting unit, a switching transistor, a writing transistor and a driving transistor; and
gate wirings of at least the switching transistor and the writing transistor formed along the row direction,
wherein the writing transistor is configured to provide a video signal at a gate electrode of the driving transistor, and the driving transistor is configured to drive the light emitting unit according to the video signal using a power supply supplied from a power supply wiring of a fixed potential,
wherein the switching transistor is connected to an anode electrode of the light emitting unit and a gate wiring of the switching transistor is formed in a wiring layer different from a gate wiring of the writing transistor, and
wherein, in a cross-sectional view, at least a portion of the power supply wiring is formed directly over or directly below the gate wiring of the switching transistor in a layering direction.

2. The display device according to claim 1, wherein the switching transistor controls a potential of the anode electrode of the light emitting unit to set the light emitting unit to a non-light emitting state.

3. The display device according to claim 1, wherein, in the pixels, processing for correcting variations in characteristics of the driving transistor is performed during a non-light emitting period of the light emitting unit in which the switching transistor is in a conductive state.

4. The display device according to claim 1, wherein a substrate on which the pixels are two-dimensionally arranged is a semiconductor substrate.

5. The display device according to claim 1, wherein the light emitting unit comprises an organic electroluminescence element.

6. The display device according to claim 1, wherein the power supply wiring of the fixed potential is formed over the gate wiring of the switching transistor in the layering direction.

7. The display device according to claim 1, wherein the power supply wiring of the fixed potential is formed below the gate wiring of the switching transistor in the layering direction.

8. An electronic device comprising a display device, the display device comprising:
pixels two-dimensionally arranged in a pixel array including a row direction and a column direction, at least one of the pixels including a light emitting unit, a switching transistor, a writing transistor and a driving transistor; and
gate wirings of at least the switching transistor and the writing transistor formed along the row direction,
wherein the writing transistor is configured to provide a video signal at a gate electrode of the driving transistor, and the driving transistor is configured to drive the light emitting unit according to the video signal using a power supply supplied from a power supply wiring of a fixed potential,
wherein the switching transistor is connected to an anode electrode of the light emitting unit and a gate wiring of the switching transistor is formed in a wiring layer different from a gate wiring of the writing transistor, and wherein, in a cross-sectional view, at least a portion of the power supply wiring is formed directly over or directly below the gate wiring of the switching transistor in a layering direction.

9. The electronic device according to claim 8, wherein the switching transistor controls a potential of the anode electrode of the light emitting unit to set the light emitting unit to a non-light emitting state.

10. The electronic device according to claim 8, wherein, in the pixels, processing for correcting variations in characteristics of the driving transistor is performed during a non-light emitting period of the light emitting unit in which the switching transistor is in a conductive state.

11. The electronic device according to claim 8, wherein a substrate on which the pixels are two-dimensionally arranged is a semiconductor substrate.

12. The electronic device according to claim 8, wherein the light emitting unit comprises an organic electroluminescence element.

13. The electronic device according to claim 8, wherein the power supply wiring of the fixed potential is formed over the gate wiring of the switching transistor in the layering direction.

14. The electronic device according to claim 8, wherein the power supply wiring of the fixed potential is formed below the gate wiring of the switching transistor in the layering direction.

* * * * *